United States Patent
Hong et al.

(10) Patent No.: US 6,768,140 B1
(45) Date of Patent: Jul. 27, 2004

(54) STRUCTURE AND METHOD IN AN HBT FOR AN EMITTER BALLAST RESISTOR WITH IMPROVED CHARACTERISTICS

(75) Inventors: Kyushik Hong, Thousand Oaks, CA (US); Richard S. Burton, Newbury Park, CA (US); Noureddine Matine, Aliso Viejo, CA (US); Debora L. Green, Bethlehem, PA (US); Charles F. Krumm, Newport Coast, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 10/115,317

(22) Filed: Apr. 3, 2002

(51) Int. Cl.[7] .............................................. H01L 29/737
(52) U.S. Cl. ...................................... 257/197; 257/582
(58) Field of Search ................................ 257/197, 198, 257/577, 578, 579, 580, 581, 582; 438/312, 314, 330, 332

(56) References Cited

U.S. PATENT DOCUMENTS

| | | | |
|---|---|---|---|
| 5,252,841 A | * 10/1993 | Wen et al. .................... | 257/197 |
| 5,608,353 A | * 3/1997 | Pratt ............................ | 330/295 |
| 5,668,388 A | * 9/1997 | Delage et al. ............... | 257/197 |
| 6,043,520 A | * 3/2000 | Yamamoto et al. .......... | 257/198 |
| 6,081,003 A | * 6/2000 | Miyakuni et al. ............ | 257/197 |
| 6,410,945 B1 | * 6/2002 | Shiota et al. ................. | 257/191 |

FOREIGN PATENT DOCUMENTS

| | | | | |
|---|---|---|---|---|
| JP | 2001007120 A | * | 1/2001 | ......... H01L/21/331 |

OTHER PUBLICATIONS

K. Yamamoto et al., "A 3.2–V Operation Single–Chip Dual–Band AlGaAs/GaAs HBT MMIC Power Amplifier with Active Feedback Circuit Technique," IEEE Journal of Solid State Circuits, vol. 35, No. 8, Aug. 2000, pp. 1109–1120.

G. Gao et al., "Emitter Ballasting Resistor Design for, and Current Handling Capability of AlGaAs/GaAs Power Heterojunction Bipolar Transistors," IEEE Transactions on Electron Devices, vol. 38, N o. 2, Feb. 1991, pp. 185–196.

* cited by examiner

*Primary Examiner*—Jack Chen
*Assistant Examiner*—Stephen W. Smoot
(74) *Attorney, Agent, or Firm*—Farjami & Farjami LLP

(57) ABSTRACT

According to one exemplary embodiment, a heterojunction bipolar transistor comprises an emitter. The heterojunction bipolar transistor further comprises a first emitter cap comprising a first high-doped layer, a low-doped layer, and a second high-doped layer, where the first high-doped layer is situated on the emitter, the low-doped layer is situated on the first high-doped layer, and the second high-doped layer is situated on the low-doped layer. The first high-doped layer, the low-doped layer, and the second high-doped layer form an emitter ballast resistor. According to this exemplary embodiment, the low-doped layer has a thickness and a dopant concentration level such that the resistance of the low-doped layer is substantially independent of the dopant concentration level, but corresponds to the thickness of the low-doped layer.

21 Claims, 4 Drawing Sheets

STRUCTURE AND METHOD IN AN HBT FOR AN EMITTER BALLAST RESISTOR WITH IMPROVED CHARACTERISTICS

BACKGROUND OF THE INVENTION

1. Field of the Invention

The present invention is generally in the field of fabrication of semiconductor devices. More particularly, the present invention is in the field of fabrication of heterojunction bipolar transistors.

2. Related Art

GaAs based devices are able to provide the power and amplification requirements of various applications, such as wireless communication applications, with improved linearity and power efficiency. Of particular interest are gallium arsenide ("GaAs") heterojunction bipolar transistors ("HBT"), which exhibit high power density capability, making them suitable as low cost and high power amplifiers in devices used in CDMA, TDMA and GSM wireless communications. However, GaAs HBTs, in particular GaAs HBTs utilizing an indium gallium phosphide ("InGaP") emitter, can exhibit undesirable thermal instability, which can lead to catastrophic failure of the HBT.

By way of background, thermal instability can cause an HBT to self-destruct when increasing temperatures inside the HBT cause a decrease in the turn-on voltage of the base-emitter junction of the HBT. As the turn-on voltage decreases, the HBT turns on harder and thus consumes more power, which further increases the temperature in the HBT. The increasing temperature further decreases the base-emitter turn-on voltage, resulting in a positive feedback loop. This phenomenon, i.e. the creation of the positive feedback loop in the HBT due to the above-explained mechanism, is more specifically referred to as "thermal runaway." Furthermore, as the overall temperature increases in the HBT, the internal areas of the HBT get hotter and, thus, carry more current than the periphery of the HBT. Accordingly, the temperature gradient causes the turn-on voltage in the internal base-emitter junction areas of the HBT to be lower than the turn-on voltage in the periphery areas of the base-emitter junction of the HBT. This results in filamentation, which occurs when localized current causes high power dissipation in a small area in an HBT with a correspondingly high increase in the localized temperature within the HBT. The end result of filamentation is self-destruction of the HBT. This phenomenon, i.e. filamentation and self-destruction of the HBT due to the above-explained mechanism, is more specifically referred to as "thermal collapse."

In one known method to prevent the above positive feedback loop from occurring, an emitter ballast resistor is integrated into a GaAs HBT by adding a lightly doped epitaxial layer above a high band gap emitter. As the current in the GaAs HBT increases, the voltage across the epitaxial emitter ballast resistor increases which tends to decrease the voltage across the base-emitter junction of the HBT, thereby limiting the current flow into the GaAs HBT, which in turn stabilizes the HBT. For example, K. Yamamoto et al., "A 3.2-V Operation Single-Chip Dual-Band AlGaAs/GaAs HBT MMIC Power Amplifier with Active Feedback Circuit Technique," IEEE Journal of Solid State Circuits, Vol. 35, No. 8, August 2000, pp. 1109–1120, discloses a lightly doped aluminum gallium arsenide ("AlGaAs") ballast layer situated on top of a high band gap emitter. By way of further example, G. Gao et al., "Emitter Ballasting Resistor Design for, and Current Handling Capability of AlGaAs/GaAs Power Heterojunction Bipolar Transistors," IEEE Transactions on Electron Devices, Vol. 38, No. 2, February 1991, pp. 185–196, discloses a lightly doped GaAs ballast layer situated on top of a high band gap emitter.

In a conventional epitaxial ballast resistor design, increased emitter resistance results mainly from two mechanisms: (1) the resistive nature of the low-doped ballast layer itself or (2) an increased thermionic emission barrier between the bottom of a low doped ballast layer, such as an emitter cap layer, and the top of a high band gap emitter. When a relatively thick layer is employed as an epitaxial ballast layer, mechanism (1) dominates, while mechanism (2) plays a significant role when the epitaxial ballast layer is relatively thin. In mechanism (1), increased emitter resistance critically depends on the doping level and thickness of the ballast layer while the emitter resistance will be mainly determined by the doping level of ballast layer in mechanism (2).

In both cases, i.e. in mechanisms (1) and (2), ballast resistance is very sensitive to the doping level of the epitaxial ballast layer and, consequently, requires very accurate doping control during the epitaxial growth process to achieve uniform, reproducible HBT characteristics. The above required accuracy in doping control creates manufacturing challenges that are difficult to meet. In addition, when mechanism (2) plays a significant role in determining total emitter resistance, emitter resistance tends to show increased base current dependency and a more negative temperature coefficient, which undesirably affects power amplifier linearity and thermal stability.

Referring now to FIG. 1, a conventional exemplary NPN GaAs HBT is illustrated. GaAs HBT 100 comprises emitter contact 120, base contacts 122 and 124, and collector contact 126. Further, GaAs HBT 100 comprises emitter cap 118, emitter cap 116, emitter 114, and base 112. In GaAs HBT 100, emitter cap 118 is indium gallium arsenide ("InGaAs") grown with an N-type dopant such as tellurium at approximately $4 \times 10^{19}$ atoms per cm$^3$, for example. Emitter cap 116 can be gallium arsenide doped with silicon at a relatively low doping level of approximately $5 \times 10^{18}$ atoms per cm$^3$. Emitter cap 116 may have a thickness of approximately 2000 Angstroms. Emitter 114 can comprise either $Al_xGa_{(1-x)}As$ or $In_xGa_{(1-x)}P$ (referred to hereinafter simply as "AlGaAs" and "InGaP") doped with silicon at a medium concentration of approximately $3 \times 10^{17}$ atoms per cm$^3$. Base 112 can be, for example, gallium arsenide doped with carbon at a typical concentration level of approximately $4 \times 10^{19}$ atoms per cm$^3$.

Continuing with FIG. 1, as shown, GaAs HBT 100 further comprises collector 130 and subcollector 110. According to conventional fabrication methods, collector 130 comprises gallium arsenide, which is uniformly and lightly doped with silicon at $1 \times 10^{16}$ atoms per cm$^3$. Immediately below collector 130 is subcollector 110, which also comprises gallium arsenide. However, subcollector 110 is doped with silicon at a significantly higher concentration, typically in the range of approximately $5 \times 10^{18}$ atoms per cm$^3$. In GaAs HBT 100, collector layer 130 can be between 0.3 microns and 2 microns thick, and subcollector 110 can be between 0.3 microns and 2 microns thick.

In previously known GaAs HBTs with an emitter ballast resistor, such as GaAs HBT 100, emitter cap 116 comprises relatively low silicon-doped gallium arsenide to provide an epitaxial emitter ballast resistor. As the current in GaAs HBT 100 increases, the voltage across the epitaxial emitter ballast resistor provided by emitter cap 116 increases which tends to reduce the voltage across the base-emitter junction of the HBT which, as discussed above, stabilizes GaAs HBT 100. Accordingly, emitter cap 116 can prevent a positive feedback loop from forming and destroying GaAs HBT 100, as discussed above. However, emitter cap 116 requires very accurate doping control during the epitaxial growth process to achieve uniform, reproducible HBT characteristics. The required accuracy in doping control of emitter cap 116 is very difficult to achieve at a relatively low silicon doping level, e.g. approximately $3 \times 10^{17}$ atoms per $cm^3$, which is required to provide sufficient ballast resistance for GaAs HBT 100. Additionally, emitter ballast resistance provided by emitter cap 116 in conventional GaAs HBT 100 suffers from undesirable instability in resistance value as the base current is varied.

Another method utilizes an external emitter resistor to protect the GaAs HBT from destruction resulting from filamentation caused by the above positive feedback loop. However, since the resistance of the external emitter resistor is not distributed across the inner areas of the GaAs HBT, the external emitter resistor does not prevent filamentation from destroying the GaAs HBT.

There is thus a need in the art for an emitter ballast resistor in an HBT that provides a stable resistance that is not dependent on doping level.

SUMMARY OF THE INVENTION

The present invention is directed to structure and method for an emitter ballast resistor in an HBT. The present invention addresses and resolves the need in the art for an emitter ballast resistor in an HBT that provides a stable resistance that is not dependent on doping level.

According to one exemplary embodiment, a heterojunction bipolar transistor comprises an emitter. The heterojunction bipolar transistor, for example, may be an NPN GaAs heterojunction bipolar transistor. The heterojunction bipolar transistor further comprises a first emitter cap comprising a first high-doped layer, a low-doped layer, and a second high-doped layer, where the first high-doped layer is situated on the emitter, the low-doped layer is situated on the first high-doped layer, and the second high-doped layer is situated on the low-doped layer. The first high-doped layer, the low-doped layer, and the second high-doped layer form an emitter ballast resistor.

The resistance of the low-doped layer is dependent on the thickness of the low-doped layer, which may be approximately 900 Angstroms. The low-doped layer, for example, may be GaAs, InGaP, or AlGaAs, and may be doped with a silicon concentration of approximately $1 \times 10^{16}$ atoms per $cm^3$.

The first high-doped layer and the second high-doped layer, for example, may be GaAs doped with a silicon concentration of between approximately $5 \times 10^{17}$ atoms per $cm^3$ and approximately $1 \times 10^{19}$ atoms per $cm^3$. The thickness of the first high-doped layer and the second high-doped layer, for example, may be approximately 150 Angstroms.

According to this exemplary embodiment, the low-doped layer has a thickness and a dopant concentration level such that the resistance of the low-doped layer is substantially independent of the dopant concentration level, but corresponds to the thickness of the low-doped layer. In another embodiment, the present invention is a method that achieves the above-described heterojunction bipolar transistor. Other features and advantages of the present invention will become more readily apparent to those of ordinary skill in the art after reviewing the following detailed description and accompanying drawings.

DETAILED DESCRIPTION OF THE INVENTION

The present invention is directed to structure and method for an emitter ballast resistor in an HBT. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 2:
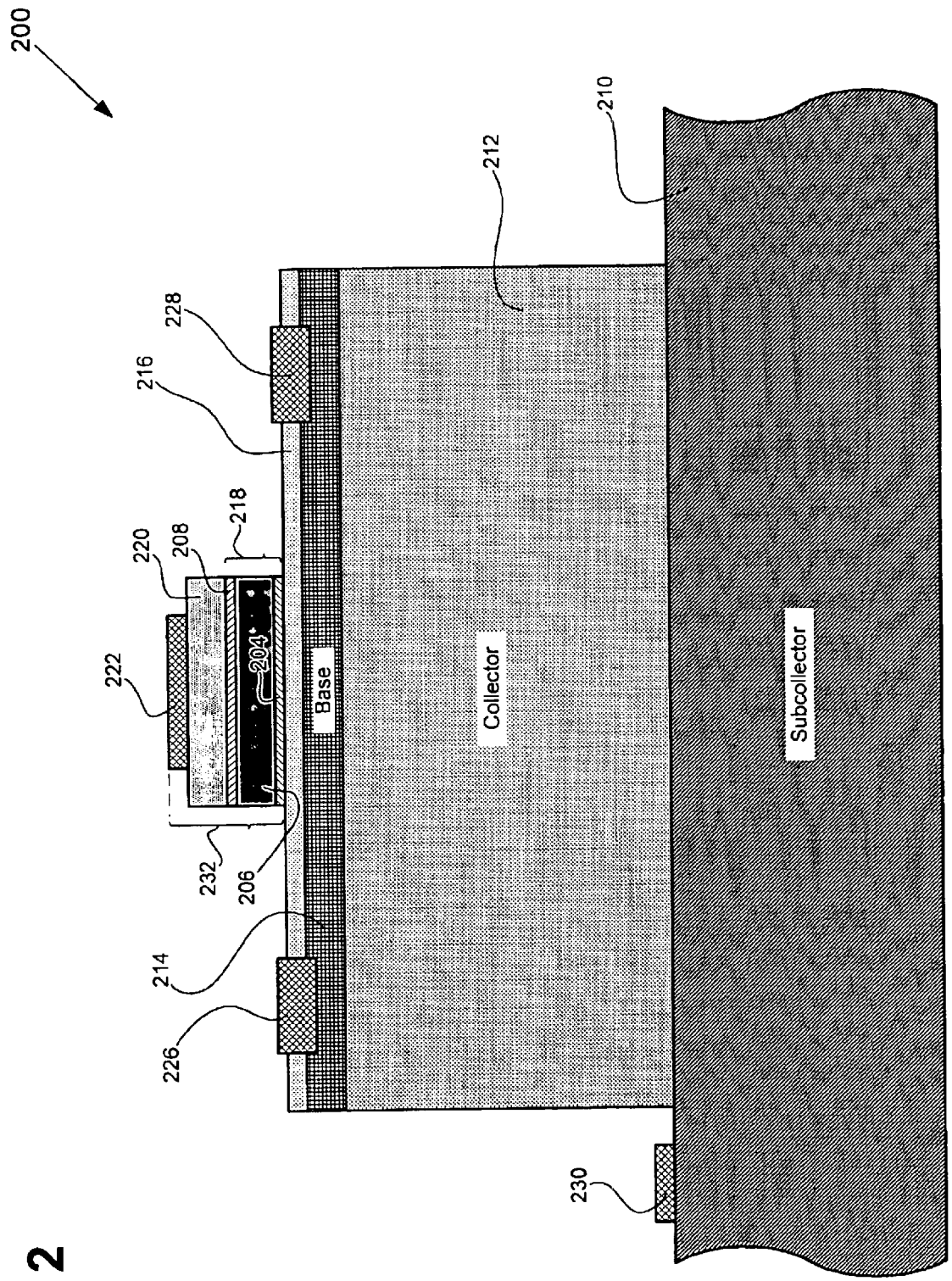
FIG. 2 illustrates a cross sectional view of some of the features of an exemplary NPN HBT fabricated in accordance with one embodiment of the present invention.

Reference is now made to FIG. 2 which shows exemplary HBT 200. HBT 200 is an exemplary NPN GaAs HBT fabricated in accordance with one embodiment of the invention. Certain details and features have been left out of FIG. 2 that are apparent to a person of ordinary skill in the art. Although HBT 200 illustrates an exemplary NPN GaAs HBT, the present invention may also apply to NPN or PNP HBTs comprising silicon, silicon germanium, aluminum gallium arsenide, indium gallium phosphide, or indium phosphide. The present invention further may also apply, in general, to any bipolar transistor.

As shown, HBT 200 comprises subcollector 210, collector 212, base 214, emitter 216, first emitter cap 218 and second emitter cap 220. According to an exemplary embodiment of the invention, first emitter cap 218 consists of three separate layers, i.e. layers 204, 206, and 208. Exemplary HBT 200 also comprises emitter contact 222, base contacts 226 and 228, and collector contact 230. As seen in FIG. 2 and for the purpose of future reference, "structure 232" in exemplary HBT 200 is shown to include first emitter cap 218, second emitter cap 220, and emitter contact 222.

Continuing with exemplary HBT 200, in the present exemplary embodiment, subcollector 210 is a highly doped N+ buried layer providing a low resistance electrical pathway from collector 212 to collector contact 230. Subcollector 210 comprises GaAs, which can be doped with, for example, silicon at between approximately $1 \times 10^{18}$ atoms per $cm^3$ and approximately $6 \times 10^{18}$ atoms per $cm^3$. In one embodiment, subcollector 210 can be between approximately 0.5 microns and approximately 1 micron thick. By way of example, subcollector 210 may be doped with silicon at a concentration level approximately equal to $5 \times 10^{18}$ atoms per cm³ and the thickness of subcollector 210 may be approximately equal to 0.9 microns.

Also shown in FIG. 2, collector 212 is situated on subcollector 210. In the present embodiment, collector 212 is a low-doped N– layer that comprises GaAs, which can be doped with, for example, silicon at a concentration level of approximately $1 \times 10^{16}$ atoms per cm³. In the present embodiment, the thickness of collector 212 can be between approximately 0.5 microns to 2 microns. In one embodiment, the thickness of collector 212 is approximately equal to 0.9 microns.

As shown in FIG. 2, base 214 is situated on collector 212. Base 214 in exemplary HBT 200 also comprises GaAs, doped with, for example, carbon at between approximately $1 \times 10^{19}$ atoms per cm³ to $6 \times 10^{19}$ atoms per cm³, making it a P+ type base. Typically, the thickness of base 214 can be between approximately 500 to 1500 Angstroms. In one embodiment base 214 may be doped with carbon at a concentration level approximately equal to $4 \times 10^{19}$ atoms per cm³ and the thickness of base 214 may be approximately equal to 900 Angstroms.

Also shown in FIG. 2, situated on top of base 214 is emitter 216, which can comprise InGaP. In one embodiment, emitter 216 may comprise AlGaAs. Emitter 216, which may be between approximately 200 Angstroms to approximately 700 Angstroms thick, can be doped with silicon at approximately $3 \times 10^{17}$ atoms per cm³, making emitter 216 an N-type emitter. In one embodiment, the thickness of emitter 216 may be approximately equal to 400 Angstroms.

Further shown in FIG. 2, layer 204 of first emitter cap 218 is formed on top of emitter 216. In the present embodiment, layer 204 of first emitter cap 218 comprises a high-doped N+ layer of GaAs, i.e. N+ GaAs. In one embodiment, layer 204 of first emitter cap 218 is doped with a silicon concentration of between approximately $5 \times 10^{17}$ atoms per cm³ and approximately $1 \times 10^{19}$ atoms per cm³. It is noted that in other embodiments, instead of silicon, other N-type dopants such as sulfur, selenium, or tellurium can be used. In fact, various references in the present application to the use of silicon as an N-type dopant are meant to provide a brief and specific example of an N-type dopant. However, in all instances, other possible N-type dopants, such as sulfur, selenium, or tellurium can be used instead of silicon. In one embodiment, layer 204 of first emitter cap 218 can be doped with a silicon concentration approximately equal to $5 \times 10^{18}$ atoms per cm³. The thickness of layer 204 of first emitter cap 218 can be approximately 150 Angstroms. In the present embodiment, layer 204 of first emitter cap 218 may be deposited by a "Metal Organic Chemical Vapor Deposition" ("MOCVD") process or a "Molecular Beam Epitaxy" ("MBE") process or other processes known in the art.

Also shown in FIG. 2, layer 206 of first emitter cap 218 is formed on top of layer 204. In the present embodiment, layer 206 of first emitter cap 218 comprises a low-doped N– layer of GaAs, i.e. N– GaAs, doped with a silicon concentration of approximately $1 \times 10^{16}$ atoms per cm³. In one embodiment, layer 206 of first emitter cap 218 may comprise a low-doped N-layer of GaAs doped with a silicon concentration between approximately $1 \times 10^{15}$ atoms per cm³ and approximately $5 \times 10^{16}$ atoms per cm³. In another embodiment, layer 206 of first emitter cap 218 may comprise a low-doped N-layer of GaAs doped with a silicon concentration approximately equal to $1 \times 10^{16}$ atoms per cm³. In yet another embodiment, layer 206 of first emitter cap 218 may comprise a low-doped N– layer of AlGaAs doped with a silicon concentration of approximately $1 \times 10^{16}$ atoms per cm³. In another embodiment, layer 206 of first emitter cap 218 may comprise a low-doped N– layer of InGaP doped with a silicon concentration of approximately $1 \times 10^{16}$ atoms per cm³. The thickness of layer 206 of first emitter cap 218 can be approximately 900 Angstroms. In the present embodiment, layer 206 of first emitter cap 218 may be deposited by a "Metal Organic Chemical Vapor Deposition" ("MOCVD") process or a "Molecular Beam Epitaxy" ("MBE") process or other processes known in the art.

As shown in FIG. 2, layer 208 of first emitter cap 218 is formed on top of layer 206. In the present embodiment, layer 208 of first emitter cap 218 comprises a high-doped N+ layer of GaAs, i.e. N+ GaAs. In one embodiment, layer 208 of first emitter cap 218 is doped with a silicon concentration of between approximately $5 \times 10^{17}$ atoms per cm³ and approximately $1 \times 10^{19}$ atoms per cm³. In one embodiment, layer 208 of first emitter cap 218 can be doped with a silicon concentration approximately equal to $5 \times 10^{18}$ atoms per cm³. The thickness of layer 208 of first emitter cap 218 can be approximately 150 Angstroms. In the present embodiment, layer 208 of first emitter cap 218 may be deposited by a "Metal Organic Chemical Vapor Deposition" ("MOCVD") process or a "Molecular Beam Epitaxy" ("MBE") process or other processes known in the art.

In FIG. 2, layers 204, 206, and 208 of first emitter cap 218 form the present invention's emitter ballast resistor, which is integrated in first emitter cap 218 in exemplary HBT 200. Thus, in the present embodiment, the present invention's emitter ballast resistor comprises a low-doped N– layer of GaAs, i.e. layer 206 of first emitter cap 218, sandwiched between two high-doped N+ layers of GaAs, i.e. layers 204 and 208 of first emitter cap 218.

Continuing with FIG. 2, second emitter cap 220 is situated on layer 208 of first emitter cap 218 and comprises indium gallium arsenide ("InGaAs") doped with tellurium at between approximately $1 \times 10^{19}$ atoms per cm³ and approximately $4 \times 10^{19}$ atoms per cm³. The thickness of second emitter cap 220 can be, for example, approximately 1000 Angstroms. Those of skill in the art will appreciate that the active region for exemplary HBT 200 is the area directly beneath first emitter cap 218, i.e. the width of the active region is equal to the width of emitter cap 218. However, those of skill will also appreciate that, as shown, emitter 216 extends beyond the active region up to, for example, the HBT's base contacts where it functions as an electrically inactive "passivation" layer over base 214.

As shown in FIG. 2, collector 212 is positioned beneath base 214 in exemplary HBT 200, resulting in a collector-base junction at their interface. It is noted, therefore, that N-type emitter 216, P-type base 214 and N-type collector 212 make up the NPN components of exemplary HBT 200.

Figure 3:
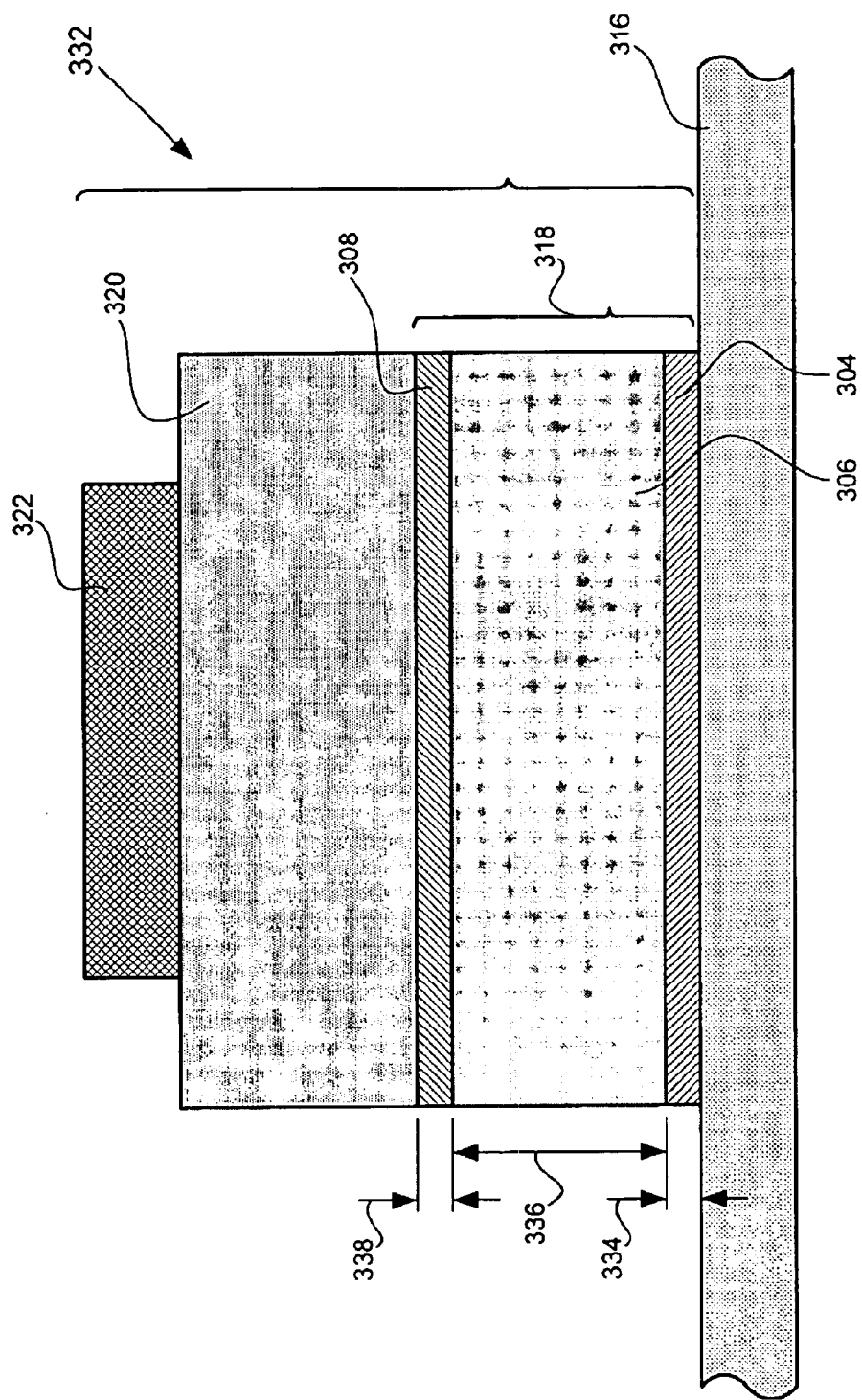
FIG. 3 illustrates a cross sectional view of some of the features of the exemplary NPN HBT of FIG. 2 fabricated in accordance with one embodiment of the present invention.

Referring now to FIG. 3, illustrated is exemplary structure 332 fabricated in accordance with one embodiment of the present invention. Structure 332 in FIG. 3 corresponds to structure 232 in FIG. 2. In particular, layers 304, 306, and 308 of first emitter cap 318, second emitter cap 320, and emitter contact 322 in FIG. 3 correspond, respectively, to layers 204, 206, and 208 of first emitter cap 218, second emitter cap 220, and emitter contact 222 in FIG. 2.

As shown in FIG. 3, in the present embodiment, thickness 334 of layer 304 of first emitter cap 318 can be approximately 150 Angstroms. Thickness 336 of layer 306 of first emitter cap 318 can be approximately 900 Angstroms, and thickness 338 of layer 308 of first emitter cap 318 can be approximately 150 Angstroms. As discussed above, layers 304 and 308 of first emitter cap 318 comprise high-doped N+ layers of GaAs, i.e. N+ GaAs, and layer 306 of first emitter cap 318 comprises a low-doped N- layer of GaAs. Thus, as discussed above, the present invention achieves an emitter ballast resistor having a low-doped N- layer of GaAs sandwiched between two high-doped N+ layers of GaAs, i.e. N+ GaAs. For example, the doping concentration of layer 306 of first emitter cap 318 can be between approximately $0.8 \times 10^{16}$ atoms per $cm^3$ and approximately $1.2 \times 10^{16}$ atoms per $cm^3$, while the doping concentrations of layers 304 and 308 of first emitter cap 318 can be between approximately $5 \times 10^{17}$ atoms per $cm^3$ and approximately $1 \times 10^{19}$ atoms per $cm^3$. As a result of the above doping level and relative thickness of layer 306, the resistance of layer 306 of first emitter cap 318 substantially determines the resistance of the invention's emitter ballast resistor.

In the present invention, as a result of sandwiching a thin, e.g. approximately 900 Angstroms, N- layer of GaAs, i.e. layer 306 of first emitter cap 318, between two high-doped N+ layers of GaAs, i.e. layers 304 and 308 of first emitter cap 318, a "Debye tail" is formed from the N+ GaAs layers to the N- GaAs layer. By way of background, a Debye tail, also referred to as a Debye length, generally refers to the distance charge carriers in an area of higher carrier density will flow or diffuse into an area of lower carrier density before being screened or relaxed. In other words, at a distance greater than the Debye length, charge carriers that diffuse from an area of higher carrier density into an area of lower carrier density will no longer affect the area of lower carrier density. The Debye length is dependent on carrier density in the higher carrier density area and temperature.

In the present invention, a Debye tail forms where electrons spill out from the N+ layers, i.e. layers 304 and 308 of first emitter cap 318, and diffuse into the N- layer, i.e. layer 306 of first emitter cap 318. The occurrence of the above Debye tail effect is dependent on the thickness of layer 306 of first emitter cap 318. For example, a Debye tail effect results in the present invention where the thickness of layer 306 of first emitter cap 318 is approximately 900 Angstroms. However, if the thickness of layer 306 is much greater than approximately 2000 Angstroms, the Debye tail effect is significantly reduced.

As a result of the Debye tail, the carrier concentration in layer 306 of first emitter cap 318 is independent of the doping level in layer 306. The carrier concentration in layer 306 of first emitter cap 318, for example, can be approximately $3 \times 10^{16}$ $cm^3$. However, the carrier concentration in layer 306 is dependent on the doping concentration in layers 304 and 308 of first emitter cap 318. As stated above, the doping concentration in layers 304 and 308 of first emitter cap 318 are much higher than the doping concentration in layer 306. Thus, the doping concentration in layers 304 and 308 is much easier to control than the doping concentration in layer 306 of first emitter cap 318, since a doping concentration inaccuracy has a greater percentage effect in layer 306 than the same inaccuracy would have in layers 304 and 308 of first emitter cap 318.

As discussed above, the carrier concentration in layer 306 of first emitter cap 318 is dependent on the thickness of layer 306 but is independent of the doping concentration in layer 306. Thus, the present invention advantageously achieves an emitter ballast resistor having a resistance that is dependent primarily on the thickness of first layer 306 of first emitter cap 318 and not on the doping concentration in layer 306. Furthermore, by utilizing layer 306 of first emitter cap 318 having a thickness of only approximately 900 Angstroms to achieve a desired resistance, the present invention substantially reduces sensitivity to manufacturing variations in all doping levels as compared to a conventional emitter ballast resistor.

As state above, in the present embodiment, the silicon doping concentration in first emitter cap layer 306 is approximately $1 \times 10^{16}$ atoms per $cm^3$. As a result, the present invention advantageously achieves an emitter ballast resistor having a resistance variation of less than 10%. In contrast, the resistance variation in a conventional emitter ballast resistor, such as emitter cap 116 in conventional exemplary GaAs HBT 100 in FIG. 1, is greater than the resistance variation achieved by the present invention by a factor of two.

Figure 1:
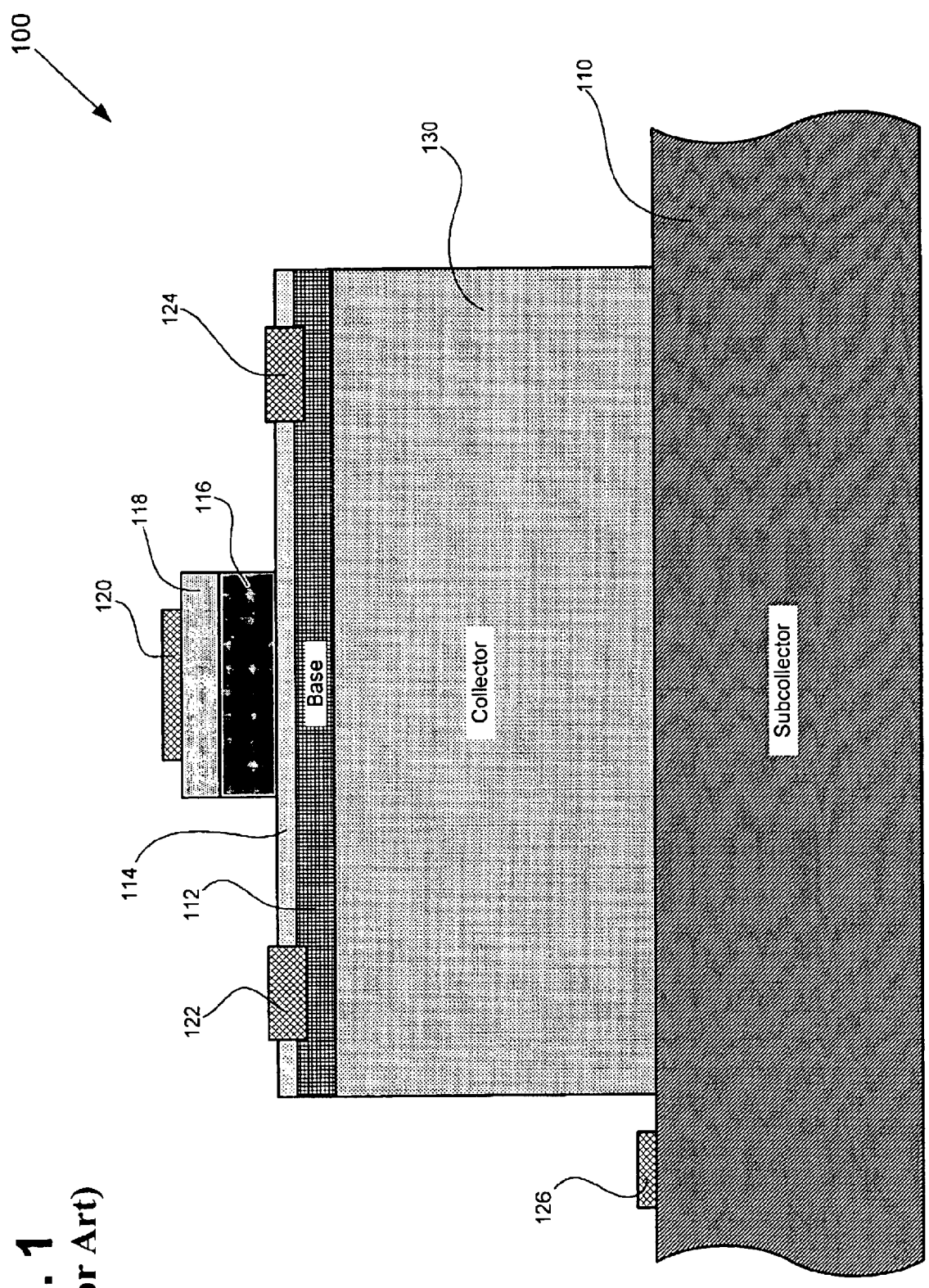
FIG. 1 illustrates a cross sectional view of some of the features of a conventional exemplary NPN HBT.

Additionally, conventional emitter ballast resistors, such as emitter cap 116 in conventional exemplary GaAs HBT 100 in FIG. 1, can exhibit resistance that is undesirably dependent on base current. For example, the resistance of a conventional emitter ballast resistor may undesirably decrease as operating current, which is generally proportional to base current, increases. In contrast, the present invention advantageously achieves an emitter ballast resistor having a resistance that is substantially independent of operating current. In one embodiment, the present invention achieves an emitter ballast resistor having a resistance that increases slightly at higher power levels to compensate for the "thermal runaway" that occurs at the higher power levels.

Thus, the present invention achieves an HBT, such as HBT 200, having a stable emitter ballast resistor that may be advantageously utilized in high current applications. For example, HBT 200 may be utilized in power amplifiers having high output current densities such as approximately 0.3, 0.5, or 1 milliampere per square micron. In one embodiment, HBT 200 may be utilized in a power amplifier in a cell phone. In such embodiment, the invention's emitter ballast resistor can advantageously protect the power amplifier from occurrence of conditions that could destroy the power amplifier via thermal runaway and/or thermal collapse. By way of example, the present invention's emitter ballast resistor can protect the power amplifier in the cell phone from damage from abnormally high collector voltage that results when a user touches the cell phone's antenna or breaks off the antenna, resulting in a high reflective power due to impedance mismatch. As another example, the invention's emitter ballast resistor can protect the power amplifier in the cell phone during high supply voltage conditions such as when the user attempts to talk over the cell phone while the cell phone is being charged.

Figure 4:
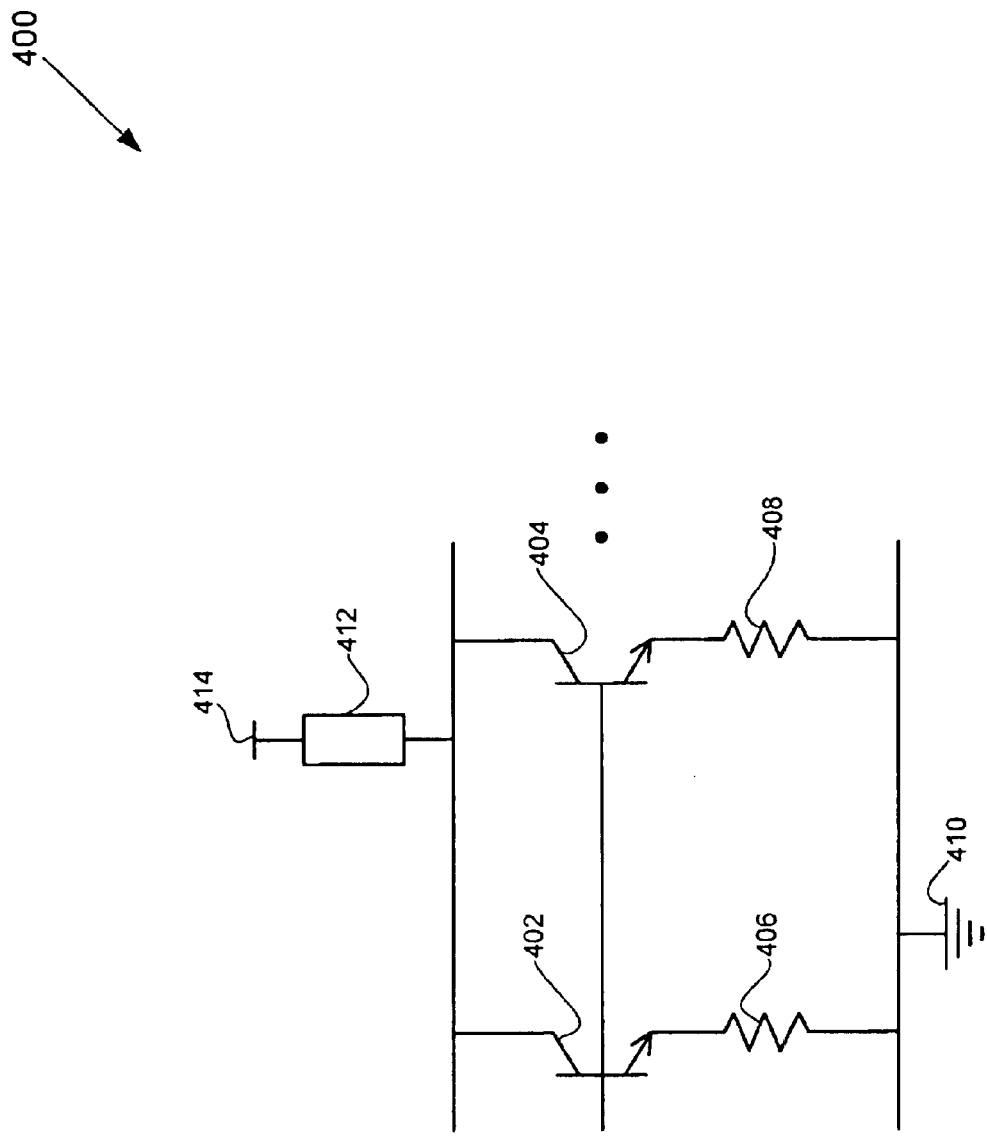
FIG. 4 illustrates a schematic diagram of two exemplary NPN HBTs in accordance with one embodiment of the present invention.

FIG. 4 shows a schematic diagram utilizing two exemplary HBTs made in accordance with the present invention. In schematic diagram 400 in FIG. 4, HBT 402 and HBT 404 correspond to HBT 200 in FIG. 2, and emitter ballast resistors 406 and 408 correspond to the emitter ballast resistor comprising layers 204, 206, and 208 of first emitter cap 218 in FIG. 2. It is noted that although emitter ballast resistors 406 and 408, respectively, are shown separated from HBTs 402 and 404 in schematic diagram 400 for simplicity of illustration, emitter ballast resistors 406 and 408 are actually situated within respective first emitter cap layers in HBTs 402 and 404. It is further noted that parallel-coupled HBTs 402 and 404 could also be thought of as a model for a single HBT transistor where the model illustrates multiple parallel HBTs existing within the single HBT including a distributed emitter ballast resistor, with each of the multiple parallel HBTs in the model being allocated a respective portion of the distributed emitter ballast resistor. It is apparent to one of ordinary skill in the art that whether FIG. 4 represents a model of a single HBT or whether FIG. 4 represents distinct and separate HBTs connected in parallel, the number of HBTs shown in FIG. 4 can be two, as presently shown, or any number greater than two, without affecting the present discussion.

As shown in FIG. 4, emitter ballast resistors 406 and 408 are coupled to ground 410. The bases of HBTs 402 and 404 are coupled together and the collectors of HBTs 402 and 404 are coupled to bias load 412. Bias load 412 provides a proper operating voltage level to the collectors of HBTs 402 and 404. Bias load 412 is coupled to voltage source 414, also referred to as VCC. Thus, as shown in FIG. 4, HBTs 402 and 404 are coupled together in parallel.

In one embodiment, parallel-coupled HBTs 402 and 404 may be utilized in a power amplifier to provide greater output current than would be available from a single HBT.

The invention's emitter ballast resistors 406 and 408 can advantageously protect parallel-coupled HBTs 402 and 404, respectively, from damage or destruction resulting from excess output current or abnormally high collector voltage. In another embodiment, an array comprising multiple parallel-coupled HBTs, such as HBTs 402 and 404, may be utilized in a power amplifier to provide a high current output. In such embodiment, the invention's emitter ballast resistors, such as emitter ballast resistors 406 and 408, can protect each individual parallel-coupled HBT in the array from damage resulting from excess output current or abnormally high collector voltage. The above protection provided by the present invention for each individual HBT in the array is advantageous since failure of any individual HBT in the array results in failure of the entire array.

It is appreciated by the above detailed disclosure that this invention achieves an emitter ballast resistor comprising three layers in the first emitter cap of an HBT, where the emitter ballast resistor exhibits a stable resistance that is independent of doping level. From the above description of the invention it is manifest that various techniques can be used for implementing the concepts of the present invention without departing from its scope. Moreover, while the invention has been described with specific reference to certain embodiments, a person of ordinary skills in the art would appreciate that changes can be made in form and detail without departing from the spirit and the scope of the invention. For example, it is appreciated that other types of materials such as N– AlGaAs or N– InGaP can be sandwiched between two highly doped GaAs layers to form the invention's emitter ballast resistor. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, structure and method for an emitter ballast resistor in an HBT have been described.

What is claimed is:

1. A heterojunction bipolar transistor comprising:
    an emitter;
    a first emitter cap comprising a first high-doped layer, a low-doped layer, and a second high-doped layer, said first high-doped layer being situated directly on said emitter, said low-doped layer being situated on said first high-doped layer, said second high-doped layer being situated on said low-doped layer;
    said low-doped layer having a dopant concentration level and a thickness, wherein said thickness is selected to cause a Debye tail effect to form in said low-doped layer, wherein said thickness is less than 2000.0 Angstroms and wherein said Debye tail effect causes a ballast resistance of said emitter to be substantially independent of said dopant concentration level.

2. The heterojunction bipolar transistor of claim 1 wherein said thickness of said low-doped layer is approximately 900 Angstroms.

3. The heterojunction bipolar transistor of claim 1 wherein said low-doped layer comprises GaAs doped with an N-type dopant having a concentration of approximately $1\times10^{16}$ atoms per $cm^3$.

4. The heterojunction bipolar transistor of claim 1 wherein said low-doped layer comprises InGaP doped with an N-type dopant having a concentration of approximately $1\times10^{16}$ atoms per $cm^3$.

5. The heterojunction bipolar transistor of claim 1 wherein said low-doped layer comprises AlGaAs doped with an N-type dopant having a concentration of approximately $1\times10^{16}$ atoms per $cm^3$.

6. The heterojunction bipolar transistor of claim 1 wherein said first high-doped layer and said second high-doped layer comprise GaAs doped with an N-type dopant having a concentration of between approximately $5\times10^{17}$ atoms per $cm^3$ and approximately $1\times10^{19}$ atoms per $cm^3$.

7. The heterojunction bipolar transistor of claim 1 wherein a thickness of said first high-doped layer and said second high-doped layer is approximately 150 Angstroms.

8. The heterojunction bipolar transistor of claim 1 wherein said heterojunction bipolar transistor is an NPN heterojunction bipolar transistor.

9. The heterojunction bipolar transistor of claim 1 wherein said heterojunction bipolar transistor is a PNP heterojunction bipolar transistor.

10. The heterojunction bipolar transistor of claim 1 wherein said first emitter cap is deposited by a process selected from the group consisting of MOCVD and MBE.

11. A heterojunction bipolar transistor comprising:
    an emitter;
    a first emitter cap comprising a first high-doped layer, a low-doped layer, and a second high-doped layer, said first high-doped layer being situated on said emitter, said low-doped layer being situated on said first high-doped layer, said second high-doped layer being situated on said low-doped layer;
    said low-doped layer having a dopant concentration level and a thickness, wherein said thickness is selected such that a ballast resistance of said emitter is substantially independent of said dopant concentration level, and wherein said thickness is approximately 900 Angstroms.

12. An amplifier comprising:
    at least one heterojunction bipolar transistor having an emitter and an emitter ballast resistor, said emitter ballast resistor comprising a first high-doped layer, a low-doped layer, and a second high-doped layer, said first high-doped layer being situated directly on said emitter;
    said low-doped layer having a dopant concentration level and a thickness, wherein said thickness is selected to cause a Debye tail effect to form in said low-doped layer, wherein said thickness is less than 2000.0 Angstroms, and wherein said Debye tail effect causes a resistance of said emitter ballast resistor to be substantially independent of said dopant concentration level.

13. The amplifier of claim 12 wherein said thickness of said low-doped layer is approximately 900 Angstroms.

14. The amplifier of claim 12 wherein said low-doped layer comprises GaAs doped with an N-type dopant having a concentration of approximately $1\times10^{16}$ atoms per $cm^3$.

15. The amplifier of claim 12 wherein said low-doped layer comprises InGaP doped with an N-type dopant having a concentration of approximately $1\times10^{16}$ atoms per $cm^3$.

16. The amplifier of claim 12 wherein said low-doped layer comprises AlGaAs doped with an N-type dopant having a concentration of approximately $1\times10^{16}$ atoms per $cm^3$.

17. The amplifier of claim 12 wherein said first high-doped layer and said second high-doped layer comprise GaAs doped with an N-type dopant having a concentration of between approximately $5\times10^{17}$ atoms per $cm^3$ and approximately $1\times10^{19}$ atoms per $cm^3$.

18. The amplifier of claim 12 wherein a thickness of said first high-doped layer and said second high-doped layer is approximately 150 Angstroms.

19. The amplifier of claim 12 wherein said heterojunction bipolar transistor is an NPN heterojunction bipolar transistor.

20. The amplifier of claim 12 wherein said heterojunction bipolar transistor is a PNP heterojunction bipolar transistor.

21. An amplifier comprising:
   at least one heterojunction bipolar transistor having an emitter ballast resistor, said emitter ballast resistor comprising a first high-doped layer, a low-doped layer, and a second high-doped layer;
   said low-doped layer having a dopant concentration level and a thickness, wherein said thickness is selected such that a resistance of said emitter ballast resistor is substantially independent of said dopant concentration level, and wherein said thickness is approximately 900 Angstroms.

* * * * *